(12) United States Patent
Wang et al.

(10) Patent No.: US 11,183,661 B2
(45) Date of Patent: Nov. 23, 2021

(54) OLED PACKAGE STRUCTURE, DISPLAY PANEL AND METHOD FOR PREPARING PACKAGE STRUCTURE

(71) Applicant: BOE TECHNOLOGY GROUP CO., LTD., Beijing (CN)

(72) Inventors: Tao Wang, Beijing (CN); Song Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 574 days.

(21) Appl. No.: 16/071,107

(22) PCT Filed: Sep. 29, 2017

(86) PCT No.: PCT/CN2017/104500
§ 371 (c)(1),
(2) Date: Jul. 19, 2018

(87) PCT Pub. No.: WO2018/171163
PCT Pub. Date: Sep. 27, 2018

(65) Prior Publication Data
US 2021/0193948 A1    Jun. 24, 2021

(30) Foreign Application Priority Data
Mar. 22, 2017    (CN) .......................... 201710175608.1

(51) Int. Cl.
*H01L 51/52*    (2006.01)
*H01L 51/56*    (2006.01)
(52) U.S. Cl.
CPC ............ *H01L 51/524* (2013.01); *H01L 51/56* (2013.01)

(58) Field of Classification Search
None
See application file for complete search history.

(56) References Cited

U.S. PATENT DOCUMENTS

| 9,362,523 B2 | 1/2016 | Zhang |
| 2006/0012300 A1 | 1/2006 | Lan et al. |

(Continued)

FOREIGN PATENT DOCUMENTS

| CN | 101060163 A | 10/2007 |
| CN | 103311445 A | 9/2013 |

(Continued)

OTHER PUBLICATIONS

Search Report and Written Opinion for International Application No. PCT/CN2017/104500 dated Jan. 3, 2018.

(Continued)

*Primary Examiner* — J. E. Schoenholtz
(74) *Attorney, Agent, or Firm* — Calfee, Halter & Griswold LLP

(57) ABSTRACT

The present disclosure discloses an OLED package structure, a display panel and a method for preparing a package structure. The OLED package structure includes a substrate, an OLED disposed on the substrate, and a reinforcement hole disposed on at least one of the substrate and the OLED and extending along a side of the OLED towards the substrate; and an encapsulation layer covering the OLED, and at least a portion of the encapsulation layer extending into the reinforcement hole. Therefore, the reliability of the package structure can be increased, the adhesive strength of the package layer can be increased, peeling or package failure can be prevented, and the service life of the package structure can be improved.

17 Claims, 7 Drawing Sheets

(56) References Cited

U.S. PATENT DOCUMENTS

| | | | | |
|---|---|---|---|---|
| 2014/0353625 | A1* | 12/2014 | Yi | ............... H01L 51/5281 |
| | | | | 257/40 |
| 2015/0221888 | A1* | 8/2015 | Zhang | ............ H01L 31/0488 |
| | | | | 257/40 |
| 2016/0343981 | A1* | 11/2016 | Sonoda | ............ H01L 51/0097 |
| 2018/0233682 | A1* | 8/2018 | Lin | ............ B32B 27/06 |

FOREIGN PATENT DOCUMENTS

| | | |
|---|---|---|
| CN | 103325958 A | 9/2013 |
| CN | 103474561 A | 12/2013 |
| CN | 203760519 U | 8/2014 |
| CN | 203883009 U | 10/2014 |
| CN | 104538555 A | 4/2015 |
| CN | 104538566 A | 4/2015 |
| CN | 204333042 U | 5/2015 |
| CN | 105576149 A | 5/2016 |
| CN | 106935728 A | 7/2017 |
| JP | 2011165497 A | 8/2011 |

OTHER PUBLICATIONS

First Office Action for Chinese Patent Application No. 201710175608.1 dated Jan. 29, 2018.

\* cited by examiner

OLED PACKAGE STRUCTURE, DISPLAY PANEL AND METHOD FOR PREPARING PACKAGE STRUCTURE

CROSS-REFERENCE TO RELATED APPLICATIONS

This application is based upon International Application No. PCT/CN2017/104500, flied on Sep. 29, 2017, which is based upon and claims priority to Chinese patent application No. 201710175608.1 filed on Mar. 22, 2017, the entire contents of which are hereby incorporated by reference.

TECHNICAL FIELD

The present disclosure relates to the field of electronics, and in particular, to an organic light emitting device (OLED) package structure, a display panel, and a method of manufacturing a package structure.

BACKGROUND

With the development of display technology, bendable flexible display devices based on flexible substrates have emerged. Among them, OLED has the characteristics of self-luminescence, so compared with other display devices, it has the advantages of low power consumption and good display brightness. OLED displays made on flexible substrates are also easier to achieve bendable displays with smaller bend radii. Therefore, the production of OLED display panels based on flexible substrates has attracted widespread attention.

SUMMARY

This application is based on the inventor's discovery of the following facts:

The existing OLED devices have problems such as short lifetime and poor reliability of the package structure. The inventors have found out through in-depth research and a large number of experiments that this is mainly because the flexible OLED and other similar devices, after being bent multiple times or used for a period of time, are prone to film peeling or packaging failure at the edges of the OLED package structure, especially the corner thereof. After in-depth study by the inventor, the main reason for the above phenomenon is as below. On the one hand, in the existing OLED packaging process, after the film packaging is completed, it is necessary to apply a protective film on the outside of the package structure before the polarizer is laminated in order for the display element to be protected. When being performed the next process, such as when the protective film is removed, the package structure is easily peeled off at the edges of the package structure, especially at its corners. On the other hand, when the flexible OLED device is bent, the stress onto the edges and corners of the package structure is the greatest, so it is very possible that the package failure appears after a period of use. The inventors have found out through a lot of experiments that each layer of material of the encapsulation layer (having organic/inorganic multilayer structure) is connected by van der Waals force only, and the bonding strength between the inorganic layer and the organic layer is small. During the next process or during the bending process of the device, defects are particularly likely to occur at the edges of the encapsulation layer, particularly at the corners, and after the encapsulation layer is defective, the OLED stripping is easily caused.

In an aspect of the present disclosure, the present disclosure provides an OLED package structure. According to an embodiment of the present disclosure, the OLED package structure includes: a substrate; an OLED disposed on the substrate; a reinforcement hole disposed on at least one of the substrate and the OLED, and extending along a side of the OLED towards the substrate; and an encapsulating layer covering the OLED, and at least a portion of the encapsulation layer extends into the reinforcement hole. Therefore, the reliability of the package structure can be increased, the adhesive strength of the package layer can be increased, peeling or package failure can be prevented, and the service life of the package structure can be improved.

According to an embodiment of the present disclosure, the encapsulation layer includes at least one inorganic sub-layer and at least one organic sub-layer stacked in sequence, and the inorganic sub-layer is disposed on a surface of a side of the OLED away from the substrate. As a result, the OLED can be protected from water and oxygen.

According to an embodiment of the present disclosure, at least one of the organic sub-layers extends into the reinforcement hole. Thus, the organic sub-layer can contact with the substrate, thereby enhancing the bonding force between the encapsulation layer and the substrate.

According to an embodiment of the present disclosure, a plurality of the reinforcement holes are included. As a result, the bonding force between the encapsulating layer and other structures can be further improved.

According to an embodiment of the present disclosure, the plurality of reinforcement holes are provided at an edge of the OLED. As a result, the reinforcement holes can be provided without affecting the display performance, and peeling of the encapsulating layer at the edges can be prevented.

According to an embodiment of the present disclosure, the plurality of reinforcement holes are evenly distributed along an edge of the OLED. As a result, the adhesion between the encapsulating layer and the substrate can be further enhanced and peeling can be prevented.

According to an embodiment of the present disclosure, an edge of the OLED has a corner, and the plurality of reinforcement holes are disposed at the corner. The stress applied to the corners of the edge of the OLED is large, and so the region where the peeling probability is the highest is generated. Thus, the region can be further protected and the peeling phenomenon can be prevented.

According to an embodiment of the present disclosure, at least a part of the inner wall of the reinforcement hole is made of an organic material. Thus, the organic sub-layer in the encapsulating layer can be in contact with the organic material of the inner wall of the reinforcement hole, and the large adhesion force between the organic materials can be utilized to enhance the encapsulation effect and prevent peeling.

According to an embodiment of the present disclosure, the substrate is made of an organic material, and the reinforcement holes extend into at least a portion of the substrate. Thus, the organic sub-layer in the encapsulation layer can be brought into contact with the organic material of the inner wall of the enhancement hole, and the greater adhesion between the organic materials can be used to enhance the encapsulation effect.

The OLED package structure further includes an array substrate disposed between the substrate and the OLED. As a result, the use performance of the OLED package structure can be further improved.

According to an embodiment of the present disclosure, the reinforcement hole extends at least into a portion of the array substrate. As a result, the package effect can be further enhanced.

According to an embodiment of the present disclosure, the array substrate includes at least one organic material layer, and the reinforcement holes extend into the at least one organic material layer. The organic sub-layer in the encapsulation layer can be in contact with the organic material layer of the array substrate, and the greater adhesion between organic materials can be utilized to enhance the encapsulation effect.

In another aspect of the present disclosure, the present disclosure provides an OLED display panel. According to an embodiment of the present disclosure, the OLED display panel includes the aforementioned OLED package structure. Therefore, the OLED display panel has the features and advantages of the OLED package structure described above, which will not be described herein.

In another aspect of the present disclosure, the present disclosure provides a method for preparing an OLED package structure. The method includes: providing a substrate; disposing an OLED on the substrate; and disposing a reinforcement hole on at least one of the substrate and the OLED such that the reinforcement hole extends along one side of the OLED toward the substrate; and disposing an encapsulation layer that covers the OLED such that at least a portion of the encapsulation layer extends into the reinforcement hole. Thus, the previously described OLED package structure can be simply obtained.

According to an embodiment of the present disclosure, disposing the encapsulation layer is achieved by the following steps: (1) the disposing an inorganic sub-layer on the side of the OLED away from the substrate; (2) disposing an organic sub-layer on a side of the inorganic sub-layer away from the OLED, an area covered by the organic sub-layer being larger than an area covered by the inorganic sub-layer, and (3) disposing the inorganic sub-layer on a side of the organic sub-layer away from the inorganic sub-layer again, wherein at least a portion of the organic sub-layer extends into the reinforcement hole. Thus, the disposing of the encapsulating layer can be easily achieved.

According to an embodiment of the present disclosure, after step (3), the following steps may be further included: (4) repeating step (2) and step (3) multiple times to form the encapsulation layer with a plurality of the inorganic sub-layers and a plurality of organic sub-layers alternating and stacking in sequence. Thus, a structure in which a plurality of inorganic sub-layers and organic sub-layers sequentially alternates and stacks can be obtained.

According to an embodiment of the present disclosure, before disposing the OLED, providing an array substrate on the substrate is included.

According to an embodiment of the present disclosure, the disposing the array substrate includes: forming, by using an etching process, the reinforcement hole and at least one of an electrode wire and an insulating layer.

BRIEF DESCRIPTION OF THE DRAWINGS

The above and/or additional aspects and advantages of the present disclosure will become apparent and easily understood from the following description of embodiments in conjunction with the accompanying drawings, in which.

REFERENCE SIGNS

Figure 1:
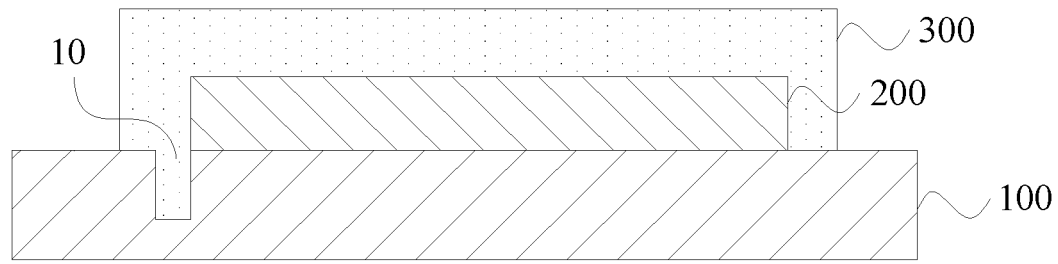
FIG. 1 shows a schematic structural view of an OLED package structure according to an embodiment of the present disclosure.

100: Substrate; 200: OLED; 10: Reinforcement Hole; 300: Encapsulation Layer; 310: Inorganic Sub-Layer; 320: Organic Sub-Layer; 400: Array Substrate; 410: Organic Material Layer; 420: Electrode Layer; 210: Anode; 220: Hole Injection Layer; 230: Hole Transport Layer; 240: Organic Light Emitting Layer; 250: Electron Transport Layer; 260: Electron Injection Layer; 270: Cathode; 1000: OLED Package Structure.

DETAILED DESCRIPTION

Hereinafter, embodiments of the present disclosure will be described in detail. Examples of the embodiments are shown in the accompanying drawings. The same or similar reference numerals throughout the drawings denote the same or similar elements or elements having the same or similar functions. The embodiments described below with reference to the accompanying drawings are exemplary, are used for explaining the present disclosure only, and should not be construed as limiting the present disclosure.

In the description of the present disclosure, the terms "upper", "lower", and the like indicate the orientation or positional relationship based on the orientation or positional relationship shown in the drawings, and are merely for facilitating the description of the present disclosure rather than requiring that the present disclosure must be configured and operated with the specified orientation, and therefore should not to be construed as limiting the disclosure.

The lifetime problem of OLED devices restricts the pace of its industrialization. Since the OLED is highly sensitive to water and oxygen, in order to protect the OLED, the OLED needs to be packaged. Existing used packaging methods include the use of edge coating methods to encapsulate OLEDs or thin film encapsulation (TFE) of OLEDs, in order to improve the reliability of the package structure. The existing structure of TFE is an organic/inorganic multilayer stack structure. The inorganic layer acts as a barrier to water and oxygen, while the organic layer plays a role of a planarization.

However, existing OLED packaging structures, display panels, and methods for preparing packaging structures still need to be improved.

In one aspect of the present disclosure, the present disclosure provides an OLED package structure. According to an embodiment of the present disclosure, referring to FIG. 1, the OLED package structure includes a substrate (or base) 100, an OLED 200, a reinforcement hole 10, and an encapsulation layer 300. The OLED 200 is disposed on the substrate 100, and the reinforcement hole 10 is disposed on at least one of the substrate 100 and the OLED 200, extending toward the substrate 100 along one side of the OLED 200. The encapsulation layer 300 covers the OLED 200, and at least a portion of the encapsulation layer 300 extends into the reinforcement hole 10. As a result, the reliability of the package structure can be increased, the adhesive strength of the encapsulating layer 300 can be increased, peeling or failure of the package can be prevented, and the service life of the package structure can be improved.

Hereinafter, various components of the OLED package structure will be described in detail according to specific embodiments of the present disclosure.

Figure 2:
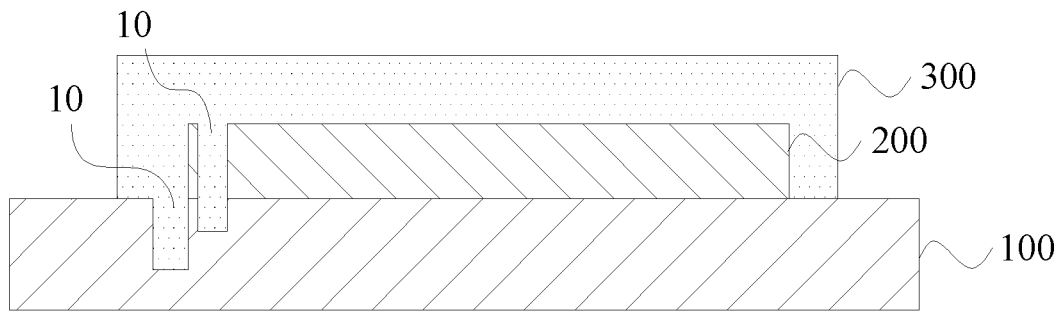
FIG. 2 shows a schematic structural view of an OLED package structure according to another embodiment of the present disclosure.
Figure 3:
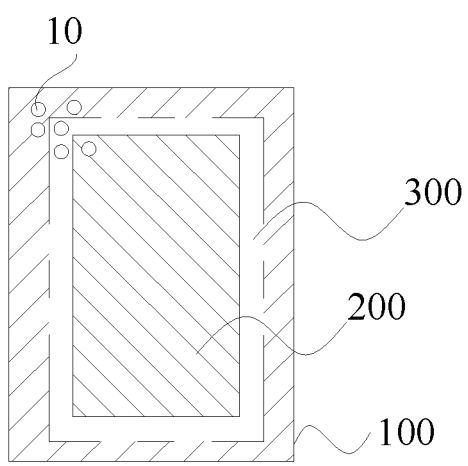
FIG. 3 shows a partial structure diagram of an OLED package structure according to an embodiment of the present disclosure.

According to the embodiment of the present disclosure, the number, location, depth, distribution, etc. of the reinforcement hole 10 are not particularly limited, and those skilled in the art can make a selection according to actual conditions. For example, according to an embodiment of the present disclosure, referring to FIG. 2, the reinforcement hole 10 may be disposed on the OLED 200 and extend from the OLED 200 into the substrate 100; or, the reinforcement hole 10 may be disposed on the substrate 100 and may extends towards the inside of the substrate 100 to a certain depth. Referring to FIG. 3, the OLED package structure may include a plurality of reinforcement holes 10. As a result, the bonding force between the encapsulating layer and other structures can be further improved.

As described above, in the OLED package structure, peeling and package failure occur easily at the edges and corners of the package, that is, at the edges and corners of the OLED 200. Therefore, the reinforcement hole 10 is disposed at the above position, which is advantageous for improving the bonding strength between the encapsulating layer 300 and other components in the OLED encapsulation structure at the position, thereby preventing the encapsulation failure and prolonging the service life of the OLED encapsulation structure. According to a specific embodiment of the present disclosure, referring to FIG. 3, a plurality of reinforcement holes 10 may be disposed at corners of the OLED 200. It should be noted that in the present disclosure, the "edge of the OLED" should be understood in a broad sense. That is, the reinforcement hole 10 may be arranged near the edges of the OLED 200, and the reinforcement hole 10 may also disposed on the OLED 200 near the edge of the OLED 200. For example, the reinforcement hole 10 may be disposed on the OLED 200. The reinforcement hole 10 may also disposed on the substrate 100 other than the OLED 200, near the edge of the OLED 200. Those skilled in the art can understand that the above-mentioned reinforcement hole 10 is used for extending the encapsulating layer 300 thereinto and enhance the bonding force between the encapsulating layer 300 and other components (the substrate 100 and/or the OLED 200). Therefore, the specific position where the reinforcement hole 10 is provided, and the distance between the reinforcement hole 10 and the OLED 200 may be adjusted according to the position of the encapsulating layer 300 so that at least a portion of the encapsulating layer 300 may extend into the reinforcement hole 10. As shown in FIG. 3, the encapsulation layer 300 covers the OLED 200, and thus the position where the reinforcement hole 10 is disposed may be an edge of the OLED 200, which does have effect on the OLED 200's light emission. Or the reinforcement hole 10 may be disposed at the boundary of encapsulation layer 300 and the OLED 200. Without prejudice to the mechanical properties of the substrate 100 and the light emitting performance of the OLED 200, the position of the reinforcement hole 10 may not be precisely controlled as long as the reinforcement hole 10 can be located within a certain range around the edge of the OLED 200.

Figure 4:
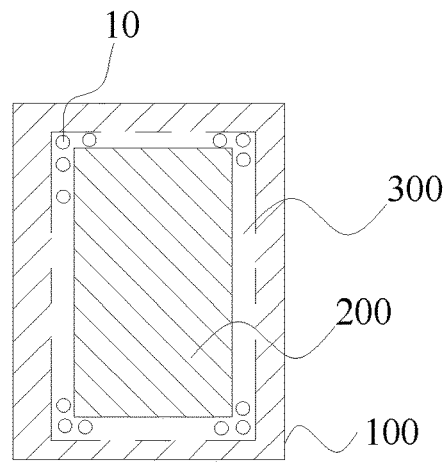
FIG. 4 shows a partial structure diagram of an OLED package structure according to another embodiment of the present disclosure.
Figure 5:
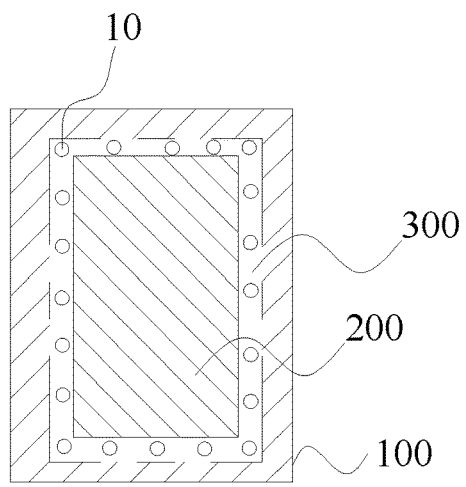
FIG. 5 shows a partial structure diagram of an OLED package structure according to yet another embodiment of the present disclosure.

According to the embodiment of the present disclosure, the specific arrangement of the plurality of reinforcement holes 10 is also not particularly limited. For example, referring to FIG. 4, the edges of the OLED 200 have corners, and a plurality of reinforcement holes 10 may be disposed at the corners of the OLED 200 and the plurality of reinforcement holes 10 are evenly distributed at the corners. As a result, the corner area can be further protected from peeling. According to further embodiments of the present disclosure, referring to FIG. 5, a plurality of reinforcement holes 10 may also be disposed at an edge of the OLED 200, and the plurality of reinforcement holes 10 may be evenly distributed along an edge of the OLED 200. As a result, the above-mentioned edge area can be further protected and peeling can be prevented.

Figure 6:
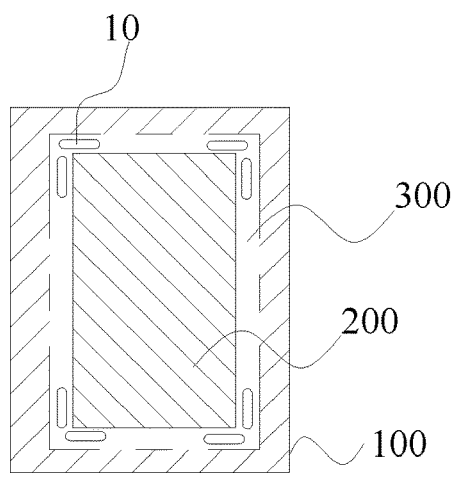
FIG. 6 shows a partial structure diagram of an OLED package structure according to yet another embodiment of the present disclosure.
Figure 7:
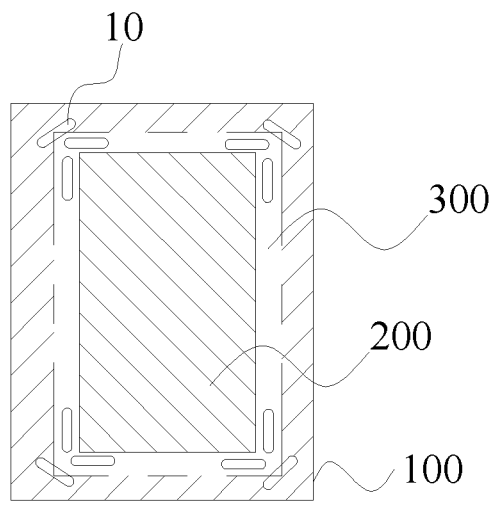
FIG. 7 shows a partial structure diagram of an OLED package structure according to yet another embodiment of the present disclosure.

According to an embodiment of the present disclosure, the shape of the reinforcement hole 10 is also not particularly limited, for example, the cross-section of the reinforcement hole 10 may be at least one of a circle, a regular polygon, and an irregular polygon. That is, when there are a plurality of reinforcement holes 10, the cross sections of the plurality of reinforcement holes 10 may be the same or different. A person skilled in the art may design the shape of the reinforcement hole 10 according to the specific structure and size of the OLED package structure and the specific shape of the location where the peeling and the package failure are likely to occur. As a result, the reliability of the package structure can be further improved. According to a specific embodiment of the present disclosure, referring to FIGS. 6 and 7, the cross section of the reinforcement hole 10 may have a shape of similar ellipse and be distributed along the edge of the OLED 200 (refer to FIG. 6). Alternatively, it is also possible to make the above elliptical reinforcement holes 10 and the edge of the OLED 200 or the edge of the encapsulating layer 300 at a certain tilt angle (refer to FIG. 7). Thus, it is advantageous to further improve the effect of the package, and it can be avoided that the display of the OLED is affected by the provision of the reinforcement hole 10.

Figure 8:
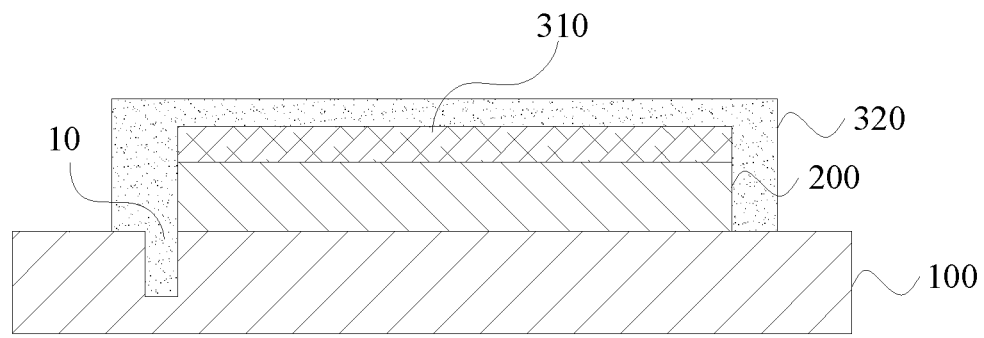
FIG. 8 shows a schematic structural view of an OLED package structure according to an embodiment of the present disclosure.

According to an embodiment of the present disclosure, referring to FIG. 8, the encapsulation layer 300 may include at least one inorganic sub-layer 310 and at least one organic sub-layer 320 that are sequentially stacked. The inorganic sub-layer 310 is disposed on a surface of a side of the OLED 200 away from the substrate 100, and the organic sub-layer 320 covers the inorganic sub-layer 310 and the OLED 200. Wherein, the inorganic sub-layer 310 can play a role of isolating water and oxygen, preventing moisture or oxygen in the external environment from entering the interior of the OLED 200, and affecting the light emitting performance and service life of the OLED 200. The organic sub-layer 320 may provide further protection for the OLED 200 and achieve overall planarization of the OLED package structure.

The inventors have found out through extensive research that the adhesion f1 between the organic sub-layer 320 and other organic materials is greater than the adhesion f2 between the layers in the OLED 200 (mainly van der Waals force), and is also much greater than adhesion f3 between the protective film and the encapsulation layer 300 (f3 generally ≤<10 gf/inch) provided by the subsequent process. The adhesion between the organic sub-layer 320 and other inorganic structures is also significantly higher than the adhesion between the inorganic-inorganic structures. Therefore, if the enhancement hole 10 is positioned at the location where the poor package is likely to occur and the enhancement hole 10 is made to contact with the organic sub-layer 320, the reliability of the package layer 300 at that location will be significantly enhanced.

According to a particular embodiment of the disclosure, at least one organic sub-layer 320 extends into the reinforcement hole 10. As a result, contact between the reinforcement hole 10 and the organic sub-layer 320 can be made so that the reliability of the package at the location can be enhanced. According to further embodiments of the present disclosure, when the substrate 100 is a flexible substrate formed of an organic material, the reinforcement holes 10 may also be made to extend into the substrate 100 made of an organic material, and at least one organic sub-layer 320 may be filled into the reinforcement holes 10. As a result, the organic sub-layer 320 can be brought into contact with the substrate 100, and the bonding force between the encapsulation layer 300 and the substrate can be enhanced.

Those skilled in the art can understand that in the actual preparation process, the above-mentioned encapsulating layer 300 is obtained by sequentially preparing a laminated inorganic sub-layer 310 and an organic sub-layer 320. Therefore, in order to prevent the inorganic sub-layer 310 from filling up the interior of the reinforcement hole 10 when preparing the first inorganic sub-layer 310, resulting that the subsequently-prepared organic sub-layer 320 cannot be extended into the reinforcement hole 10, the first prepared layer of inorganic sub-layer 310 may only cover the upper surface of the organic photosensitive device 200 and serve to isolate water and oxygen for the main portion thereof. Thus, it can be ensured that at least one organic sub-layer 320 can extend into the reinforcement hole 10. The portion not covered by the first inorganic sub-layer 310 can be covered by the subsequently-prepared inorganic sub-layer 310, so that the effect of sealing the water and oxygen of the sealing layer 300 can be ensured.

Figure 9:
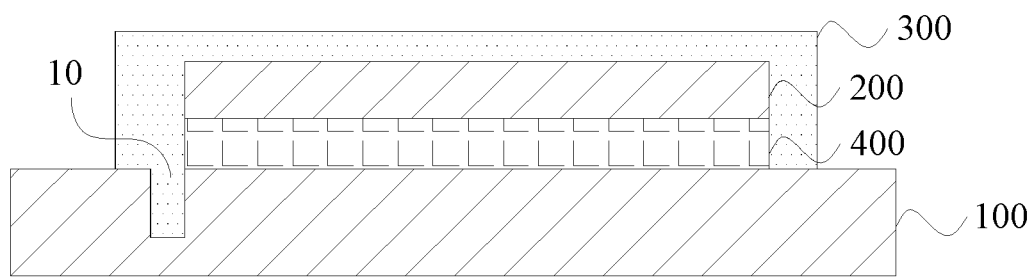
FIG. 9 shows a schematic structural diagram of an OLED package structure according to another embodiment of the present disclosure.
Figure 10:
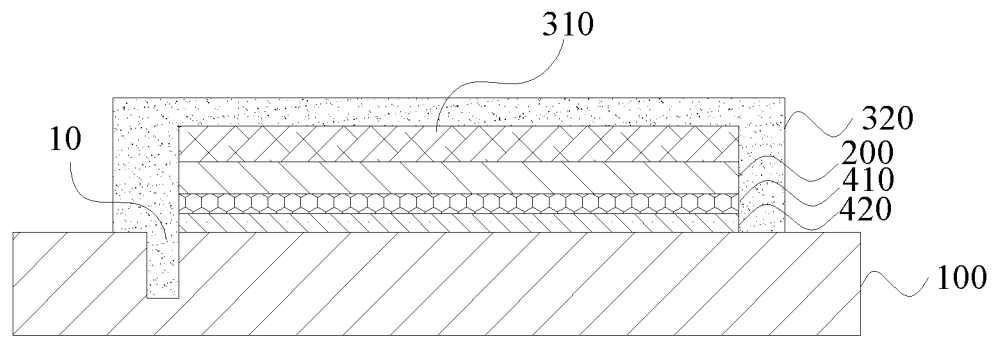
FIG. 10 shows a schematic structural view of an OLED package structure according to yet another embodiment of the present disclosure.
Figure 11:
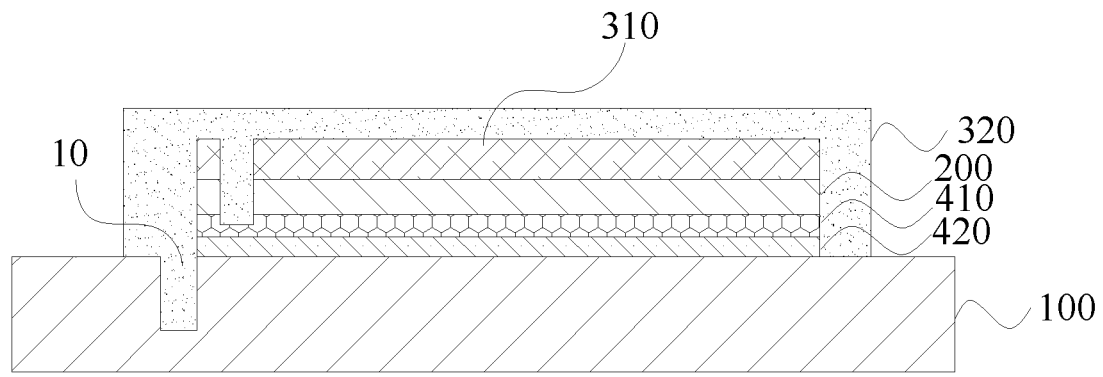
FIG. 11 shows a schematic structural view of an OLED package structure according to yet another embodiment of the present disclosure.

According to an embodiment of the present disclosure, referring to FIG. 9, the OLED package structure further includes an array substrate 400 disposed between the substrate 100 and the OLED 200. As a result, the use performance of the OLED package structure can be further improved. According to an embodiment of the present disclosure, the reinforcement hole 10 may extend at least into a portion of the array substrate 400. Those skilled in the art can understand that the specific type of the array substrate 400 is not particularly limited, and those skilled in the art can make a selection according to actual conditions. For example, referring to FIG. 10, according to an embodiment of the present disclosure, at least one organic material layer 410 is included in the array substrate 400. According to a specific embodiment of the present disclosure, the array substrate 400 may further include a thin film transistor, an electrode wire (an electrode layer 420 as shown in the figure), an insulating layer, and the like. Among them, the organic material layer 410 can be used as an insulating layer. According to an embodiment of the present disclosure, referring to FIG. 11, the reinforcement hole 10 may extend into at least one organic material layer 410. Therefore, the organic sub-layer 320 in the encapsulation layer 300 can be in contact with the organic material layer 410, and the large adhesion between the organic materials can be used to enhance the encapsulation effect.

Figure 12:
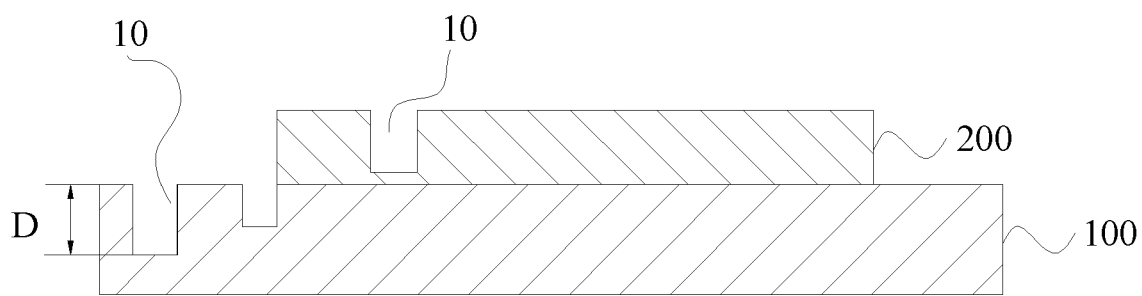
FIG. 12 shows a partial structure diagram of an OLED package structure according to an embodiment of the present disclosure.

According to an embodiment of the present disclosure, at least one organic sub-layer 320 in the encapsulation layer 300 extends into the reinforcement hole 10. As a result, it is possible to use a large viscosity of the organic material to enhance the effect of encapsulation in a portion where peeling or package failure is likely to occur. For example, according to a specific embodiment of the present disclosure, the depth of the reinforcement hole 10 may be 3-5 micrometers. According to an embodiment of the present disclosure, when the array substrate 400 is disposed on the substrate 100, structures such as electrode wires and vias in the array substrate 400 are often formed by etching. Thus, the reinforcement hole 10 may be formed, by etching, on the array substrate 400 in synchronization with disposing the array substrate 400, or the reinforcement hole 10 may be formed after the preparation of the array substrate 400 and the OLED 200 are completed. The inventors have found out through extensive experiments that when the depth of the reinforcement hole 10 is 3-5 μm, it can be ensured that the reinforcement hole 10 can extend into a part of the array substrate 400. Thus, it can be ensured that the reinforcement hole 10 having this depth can be in contact with at least the organic material layer 410 of the array substrate 400. As a result, the package effect can be further enhanced to prevent peeling. When the depth of the reinforcement hole is within the above range, it can also be ensured that the mechanical properties of the structure such as the substrate 100 are not affected, so that the OLED package structure can be ensured to have sufficient mechanical strength to meet the requirements for preparing a flexible device. It should be noted that, in the present disclosure, the term "depth of the reinforcement hole" specifically refers to the height of the inner sidewall of the reinforcement hole, such as D shown in FIG. 12.

According to an embodiment of the present disclosure, at least a part of the inner wall of the reinforcement hole 10 is made of an organic material. Thus, the organic sub-layer 320 in the encapsulation layer 300 can be in contact with the organic material on the inner wall of the reinforcement hole 10, and the large adhesive force between the organic materials can be used to enhance the encapsulation effect and prevent peeling. For example, according to a specific embodiment of the present disclosure, the organic material constituting the inner sidewall of the reinforcement hole 10 may be an organic material constituting the flexible substrate 100 or an organic material constituting the organic material layer 410 in the array substrate 400. That is, the reinforcement hole 10 may extend to at least one of the substrate 100 made of an organic material and the organic material layer 410. According to other embodiments of the present disclosure, an inner wall made of an organic material may also be formed by filling an organic material in the reinforcement hole 10 at a later stage. Thus, it is advantageous to improve the effect of the reinforcement hole 10 in preventing the failure of the package.

Figure 13:
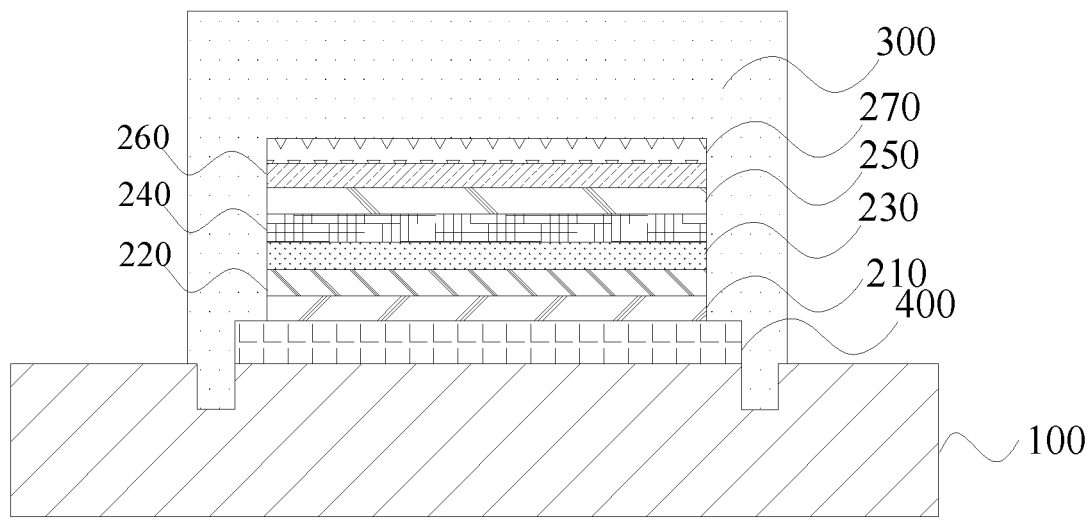
FIG. 13 shows a schematic structural view of an OLED package structure according to another embodiment of the present disclosure.

It should be noted that, in the present disclosure, the specific structure of the OLED 200 is not particularly limited, and those skilled in the art may make a selection according to actual conditions. For example, referring to FIG. 13, the OLED may include (i.e., in a direction along the array substrate 400 away from the substrate 100) sequentially from bottom to top: an anode 210, a hole injection layer 220, a hole transport layer 230, an organic light emitting layer 240, and an electrons transport layer 250, an electron injection layer 260, and a cathode 270. The encapsulation layer 300 covers the exposed entire surface of the above structure of the OLED 200 described above in order to insulate the OLED 200 from the external environment and prevent moisture, oxygen and other factors from affecting the service life of the OLED 200. On each edge of the OLED 200, reinforcement holes 10 may be provided in order to improve the encapsulation effect at the edges.

Figure 14:
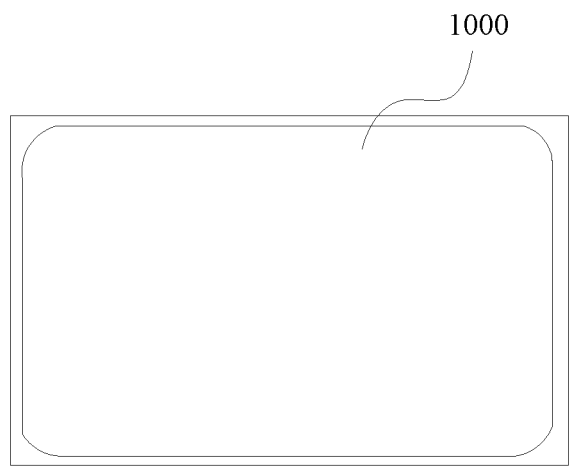
FIG. 14 shows a schematic structural view of an OLED display panel according to an embodiment of the present disclosure.

In another aspect of the present disclosure, the present disclosure provides an OLED display panel 1000. According to an embodiment of the present disclosure, referring to FIG. 14, the OLED display panel 1000 includes the aforementioned OLED package structure. Therefore, the OLED display panel 1000 has the features and advantages of the OLED package structure described above, which will not be described herein. In general, the OLED display panel has at least one of the advantages of high product yield, long service life, and the like.

Figure 15:
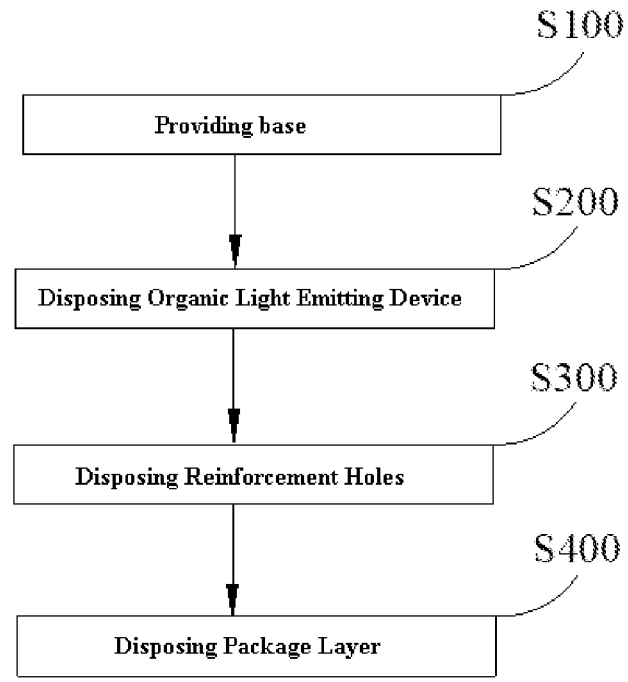
FIG. 15 shows a schematic flow chart of a method of an OLED package structure according to an embodiment of the present disclosure.

In another aspect of the present disclosure, the present disclosure provides a method for manufacturing an OLED package structure. According to an embodiment of the present disclosure, the OLED prepared by the method may be the OLED described above. According to an embodiment of the present disclosure, referring to FIG. 15, the method includes the following steps.

At S100: a substrate (or base) is provided.

According to an embodiment of the present disclosure, in this step, a substrate is provided. According to the embodiments of the present disclosure, the specific composition, shape, and size of the substrate are not particularly limited, and those skilled in the art can make a selection according to actual needs. For example, according to a specific embodiment of the present disclosure, a substrate may be formed with an organic material having a certain degree of flexibility, and further may be used to form a flexible OLED package structure.

At S200: an OLED is provided.

According to an embodiment of the present disclosure, in this step, an OLED is provided on a substrate. According to an embodiment of the present disclosure, the OLED provided in this step may have the same features and advantages as those of the OLED described above. The specific structure and composition of the OLED have been previously described in detail. This will not be repeated.

Figure 17:
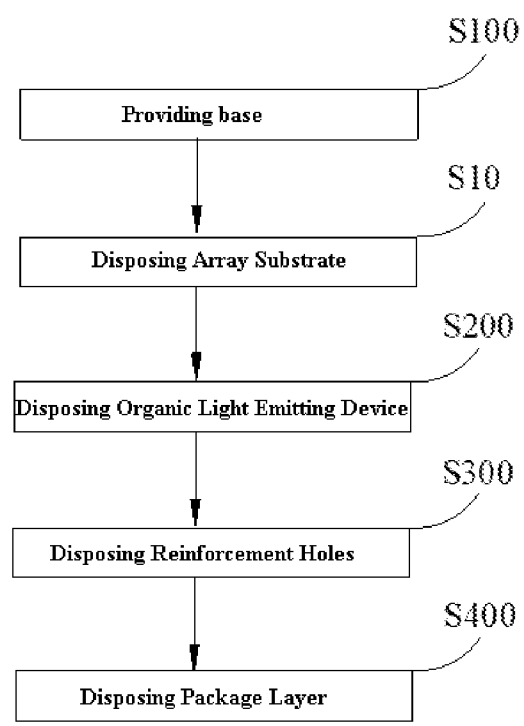
FIG. 17 shows a schematic flow chart of a method of an OLED package structure according to an embodiment of the present disclosure.

According to an embodiment of the present disclosure, when the OLED package structure further includes an array substrate, referring to FIG. 17, before the OLED is disposed, the method may further include the following steps.

At S10: an array substrate is disposed.

According to an embodiment of the present disclosure, in this step, an array substrate is disposed on a substrate. Those skilled in the art can understand that the OLED at this time is disposed on the side of the array substrate that is away from the substrate.

At S300: a reinforcement hole is disposed.

According to an embodiment of the present disclosure, in this step, a reinforcement hole is provided on at least one of the substrate and the OLED. The reinforcement hole extends along the side of the OLED toward the substrate. The number, shape, distribution, and depth of the reinforcement holes have been previously described in detail, and will not be described here.

As described above, when an array substrate is disposed on a substrate, structures such as electrode wires, insulating layers, and vias in the array substrate are often formed by etching, and thus, in this step, the reinforcement holes may be formed, when the array substrate is disposed, synchronously with the array substrate by etching, or the reinforcement holes may be formed after preparation of the array substrate and the OLED are completed. Therefore, the production steps can be saved, the production process can be simplified, no new equipment for disposing the reinforcement hole is necessary to be added, and the current production line for manufacturing the OLED package structure with a slight improvement may be used to dispose the reinforcement hole. As a result, it helps to save production costs.

At S400: an encapsulation layer is disposed.

According to an embodiment of the present disclosure, in this step, an encapsulation layer is provided so that the encapsulation layer covers the OLED and at least a portion of the encapsulation layer 300 extends into the reinforcement hole 10. Thus, the previously described OLED package structure can be simply obtained.

Figure 16:
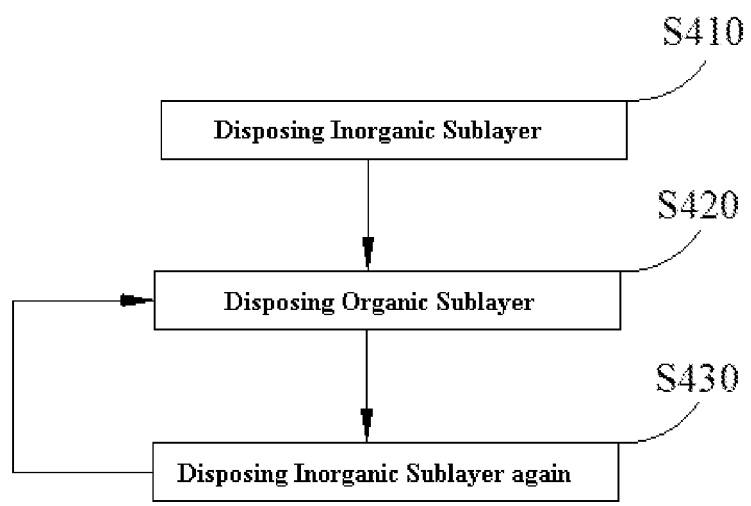
FIG. 16 shows a partial flow diagram of a method of an OLED package structure according to an embodiment of the present disclosure.

According to an embodiment of the present disclosure, referring to FIG. 16, the disposing an encapsulation layer may be achieved by the following steps.

At S410: an inorganic sub-layer is disposed.

According to an embodiment of the present disclosure, in this step, an inorganic sub-layer is provided on the side of the OLED away from the substrate. As described above, in order to ensure that at least one organic sub-layer can be extended into the reinforcement hole 10 in the finally obtained OLED, the inorganic sub-layer provided in this step can cover only the upper surface of the OLED, mainly functioning to isolate water oxygen.

At S420: an organic sub-layer is disposed.

According to an embodiment of the present disclosure, in this step, an organic sub-layer is disposed on the side of the inorganic sub-layer away from the OLED. The area covered by the organic sub-layer is larger than that covered by the inorganic sub-layer prepared in the previous step. Thus, the organic sub-layer can be extended into the reinforcement holes, and the entire outer surface of the OLED can be covered with the organic sub-layer.

At S430: an inorganic sub-layer is disposed again.

According to an embodiment of the present disclosure, in this step, an inorganic sub-layer is again provided on the side of the organic sub-layer disposed earlier away from the inorganic sub-layer. Those skilled in the art can understand that at this time, at least one layer of organic sub-layer has been extended into the reinforced pores, and therefore, the area of the inorganic sub-layer prepared in this step may not be particularly controlled. Since the inorganic sub-layer is the main structure for achieving water and oxygen isolation, disposing the inorganic sub-layer again can further improve the encapsulation effect of the encapsulation layer 300.

According to an embodiment of the present disclosure, in order to further improve the packaging effect of the encapsulation layer 300, after the inorganic sub-layer is disposed again, it may further include the following steps.

The steps of disposing the organic sub-layer and disposing the inorganic sub-layer are repeated several times so as to form an encapsulation layer with a plurality of inorganic sub-layers and a plurality of organic sub-layers alternating and stacking in sequence. Thus, a structure in which a plurality of inorganic sub-layers and organic sub-layers sequentially alternate and stack can be obtained. Those skilled in the art can understand that in this method, only the coverage area of the inorganic sub-layer provided in the first layer is controlled, so as to ensure that the inorganic sub-layer provided in the first layer does not cover the entire inner surface of the reinforcement hole. The covered area of the subsequent inorganic layer can be controlled without special control.

By the reinforcement hole(s), the organic sub-layer in the encapsulating layer can be brought into contact with the organic substrate, and the greater adhesion between the organic materials can be utilized, thereby increasing the reliability of the encapsulation and increasing the adhesion strength of the bonding edge, especially the corners, as well as preventing peeling during the next process, further improving the yield rate of the subsequent process.

In the description of the present specification, the description referring to the terms "one embodiment", "another embodiment" and the like means that the specific features, structures, materials or characteristics described in connection with the embodiment are included in at least one embodiment of the present disclosure. In this specification, the schematic representation of the above terms does not necessarily have to refer to the same embodiment or example. Furthermore, the particular features, structures, materials, or characteristics described may be combined in any suitable manner in any one or more of the embodiments or examples. In addition, those skilled in the art may combine the different embodiments or examples described in this specification and features of different embodiments or examples without conflicting with each other.

Although the embodiments of the present disclosure have been shown and described above, it is to be understood that the above embodiments are exemplary and not to be construed as limiting the present disclosure, and that those skilled in the art may, within the scope of the present disclosure, be able to make variations, modifications, substitutions and changes to the above embodiments.

What is claimed is:

1. An organic light emitting device (OLED) package structure, comprising:
   a substrate;
   an OLED on the substrate;
   a reinforcement hole on at least one of the substrate and the OLED, the reinforcement hole extending towards the substrate;
   an encapsulation layer covering the OLED, wherein at least a portion of the encapsulation layer extends into the reinforcement hole; and
   a plurality of the reinforcement holes, wherein the plurality of reinforcement holes are at at least one edge of the OLED and are evenly distributed along the edge of the OLED.

2. The OLED package structure of claim 1, wherein the encapsulation layer comprises a first inorganic sub-layer and a first organic sub-layer stacked in sequence, the first inorganic sub-layer is on a surface of a side of the OLED away from the substrate, and the first organic sub-layer covers the first inorganic sub-layer and the OLED.

3. The OLED package structure of claim 2, wherein an area covered by the first organic sub-layer is larger than an area covered by the first inorganic sub-layer, and at least a portion of the first organic sub-layer extends into the reinforcement hole.

4. The OLED package structure of claim 1, wherein the edge of the OLED has a corner, and the plurality of reinforcement hole is at the corner.

5. The OLED package structure of claim 3, wherein at least a part of an inner wall of the reinforcement hole is made of an organic material.

6. The OLED package structure of claim 5, wherein the substrate is made of an organic material, and the reinforcement hole extends into at least a portion of the substrate.

7. The OLED package structure of claim 1, further comprising: an array substrate, wherein the array substrate is between the substrate and the OLED.

8. The OLED package structure of claim 7, wherein the reinforcement hole extends at least into a portion of the array substrate.

9. The OLED package structure of claim 8, wherein the array substrate comprises at least one organic material layer, and the reinforcement hole extends into the at least one organic material layer.

10. An organic light emitting device (OLED) display panel, comprising the OLED package structure of claim 1.

11. A method for preparing an organic light emitting device (OLED) package structure, comprising:
    providing a substrate;
    forming an OLED on the substrate;
    forming a reinforcement hole on at least one of the substrate and the OLED such that the reinforcement hole extends towards the substrate wherein the plurality of reinforcement holes are at least one edge of the OLED and are evenly distributed along the edge of the OLED; and
    forming an encapsulation layer covering the OLED such that at least a portion of the encapsulation layer extends into the reinforcement hole.

12. The method according to claim 11, wherein the forming an encapsulation layer is implemented by the following steps:
    (1) forming a first inorganic sub-layer on a side of the OLED away from the substrate;
    (2) forming an organic sub-layer on a side of the first inorganic sub-layer away from the OLED such that an area covered by the organic sub-layer is larger than an area covered by the first inorganic sub-layer and at least a portion of the organic sub-layer extends into the reinforcement hole, and
    (3) forming an inorganic sub-layer on a side of the organic sub-layer away from the first inorganic sub-layer again.

13. The method according to claim 12, after the step of (3), further comprising step of:
    (4) repeating the steps of (2) and (3) multiple times to form the encapsulation layer with a plurality of the second inorganic sub-layers and a plurality of the organic sub-layers alternating and stacking in sequence.

14. The method according to claim 11, before the forming an OLED, further comprising forming an array substrate on the substrate, wherein the forming the array substrate comprises:

forming, by using an etching process, the reinforcement hole and at least one of an electrode wire and an insulating layer.

15. The OLED package structure of claim 3, wherein the encapsulation layer further comprises a plurality of second inorganic sub-layers and a plurality of second organic sub-layers, the plurality of second inorganic sub-layers and the plurality of second organic sub-layers alternating and stacking in sequence.

16. The OLED package structure of claim 7, wherein the OLED comprises in a direction away from the array substrate sequentially: an anode, a hole injection layer, a hole transport layer, an organic light emitting layer, and an electrons transport layer, an electron injection layer, and a cathode, the encapsulation layer covers an exposed entire surface of the OLED, and the reinforcement hole is on each of the edge of the OLED.

17. The OLED package structure of claim 9, wherein the reinforcement hole has a depth of 3-5 micrometers.

* * * * *